(12) United States Patent
Akino et al.

(10) Patent No.: US 7,245,002 B2
(45) Date of Patent: Jul. 17, 2007

(54) SEMICONDUCTOR SUBSTRATE HAVING A STEPPED PROFILE

(75) Inventors: Yutaka Akino, Kanagawa-ken (JP); Tadashi Atoji, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 666 days.

(21) Appl. No.: 10/143,015

(22) Filed: May 13, 2002

(65) Prior Publication Data

US 2002/0132451 A1    Sep. 19, 2002

Related U.S. Application Data

(62) Division of application No. 09/238,571, filed on Jan. 28, 1999, now Pat. No. 6,417,108.

(30) Foreign Application Priority Data

| Feb. 4, 1998 | (JP) | ................................. 10-023066 |
| Dec. 25, 1998 | (JP) | ................................. 10-370316 |

(51) Int. Cl.
*H01L 29/06* (2006.01)
*H01L 27/01* (2006.01)

(52) U.S. Cl. ...................... 257/623; 257/347; 257/618; 257/626

(58) Field of Classification Search ................ 257/347, 257/618, 623, 626
See application file for complete search history.

(56) References Cited

U.S. PATENT DOCUMENTS 3,481,030 A * 12/1969 Koelmans et al. .......... 438/151

| 5,152,857 A | 10/1992 | Ito et al. ...................... 156/153 |
| 5,340,435 A | 8/1994 | Ito et al. ...................... 156/632 |
| 5,371,037 A | 12/1994 | Yonehara ...................... 437/86 |
| 5,374,564 A | 12/1994 | Bruel ............................ 437/24 |
| 5,482,871 A * | 1/1996 | Pollack ........................ 438/151 |
| 5,668,045 A | 9/1997 | Golland et al. .............. 438/459 |
| 5,937,312 A | 8/1999 | Iyer et al. .................... 438/459 |
| 5,952,694 A | 9/1999 | Miyawaki et al. .......... 257/347 |
| 6,090,688 A | 7/2000 | Ogawa et al. .............. 438/459 |
| 6,110,391 A | 8/2000 | Takei et al. .................... 216/2 |
| 6,329,265 B1 | 12/2001 | Miyawaki et al. .......... 438/401 |

FOREIGN PATENT DOCUMENTS

| CN | 1155755 A | 7/1997 |
| EP | 0444942 | 9/1991 |
| EP | 0451993 | 10/1991 |
| JP | 5021338 | 1/1993 |
| JP | 05-211128 | 8/1993 |
| JP | 07-302889 | 11/1995 |
| WO | WO 97/27621 | 7/1997 |
| WO | WO97/27621 | 7/1997 |

OTHER PUBLICATIONS

Notification of the First Office Action, Patent Office of PRC Feb. 21, 2003.

* cited by examiner

*Primary Examiner*—Ori Nadav
(74) *Attorney, Agent, or Firm*—Fitzpatrick, Cella, Harper & Scinto (57) ABSTRACT

A semiconductor substrate which effectively prevents a chipping phenomenon, wherein the outer peripheral extremity of the insulation layer is located between the outer peripheral extremity of the semiconductor layer and the outer peripheral extremity of the support member, and wherein the semiconductor layer and the insulation layer produce a stepped profile.

1 Claim, 10 Drawing Sheets

SEMICONDUCTOR SUBSTRATE HAVING A STEPPED PROFILE

This application is a division of Application Ser. No. 09/238,571, filed Jan. 28, 1999, now U.S. Pat. No. 6,417,108.

BACKGROUND OF THE INVENTION

1. Field of the Invention

This invention relates to a semiconductor substrate comprising a semiconductor layer arranged on a supporting base member and also to a method of manufacturing such a semiconductor substrate.

2. Related Background Art

SOI (semiconductor on insulator) substrates having an SOI structure obtained by forming a single crystal semiconductor layer on an insulation layer are well known. Devices comprising an SOI substrate provide a number of advantages over ordinary Si substrates, including the following:
(1) easy dielectric separation and adaptability to an enhanced degree of integration;
(2) excellent radiation resistance;
(3) small stray capacitance and potential for high speed device operation;
(4) no need of well-forming process;
(5) reliable latch-up prevention; and
(6) capability of reducing the film thickness and forming fully depleted type field effect transistors.

Because of the advantages of the SOI structure including the above, massive efforts have been paid for developing various methods of manufacturing substrates having an SOI structure in the last decades.

The SOI technology can go back to the days of the SOS (silicon on sapphire) technology of forming an Si layer on a single crystal sapphire substrate by means of hetero-epitaxial growth, using a CVD (chemical vapor phase growth) method. While the SOS technology is appreciated by many as one of the most matured technologies, it has not been commercialized remarkably because it is accompanied by a number of drawbacks including the generation of a large number of crystal defects due to lattice misalignment along the interface of the Si layer and the underlying sapphire substrate, the existence of aluminum mixed into the Si layer from the sapphire substrate originally containing it, a high cost of the substrate and a poor adaptability to the trend toward larger substrates.

The SIMOX (separation by ion implanted oxygen) technology followed the SOS technology. There have been various research efforts paid in the field of the SIMOX technology to reduce the crystal defects and the manufacturing cost. The methods known to date other than the SIMOX technology include a method of bonding a pair of wafers with an oxide film interposed therebetween and polishing or etching one of the wafers to leave a thin single crystal Si layer on the oxide film, a method of implanting hydrogen ions from the surface of an Si substrate carrying thereon an oxide film to a predetermined depth, bonding the substrate to another substrate and then peeling off the latter substrate with a thin single crystal Si layer left on the oxide film typically by means of heat treatment.

With the above method of manufacturing an SOI semiconductor substrate by bonding a pair of silicon wafers to each other with an insulation film interposed therebetween and thinning one of the substrates to produce a thin film or an Si layer on the insulation film, the strength of bonding the silicon substrates can be reduced and even nullified in the peripheral area as it is adversely affected typically by the operation of beveling the substrates.

Then, SOI wafers under such conditions can become chipped in areas where the bonding strength is not sufficient and the surfaces of the wafers can become damaged, if partly, by Si debris in the course of manufacturing semiconductor devices to reduce the yield of manufacturing high quality semiconductor devices.

To cope with this problem, techniques have been developed for removing silicon layers in areas showing a weak bonding strength. For instance, Japanese Patent No. 2658135 discloses a technique for preventing a chipping phenomenon from occurring in a semiconductor substrate comprising a semiconductor layer arranged on a support member by mechanically grinding the outer peripheral edge of the support member by means of a wheel having a electrodeposition surface of diamond. However, highly integrated high-density semiconductor devices require further preventive measures for preventing the appearance of fine debris.

Figure 13A:
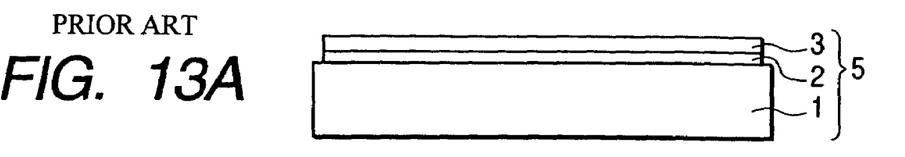
FIGS. 13A, 13B, 13C, 13D and 13E are schematic cross sectional views of a semiconductor substrate, showing different steps of a known method of manufacturing a semiconductor substrate.
Figure 13B:
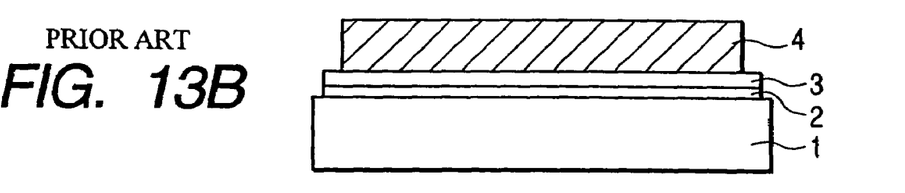
Figure 13C:
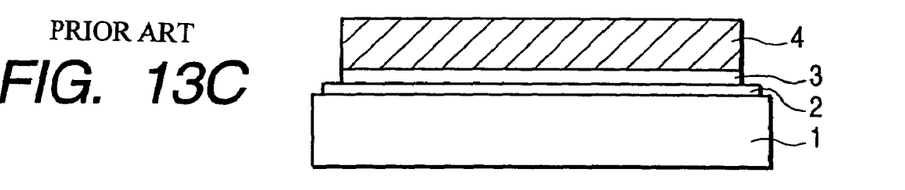
Figure 13D:
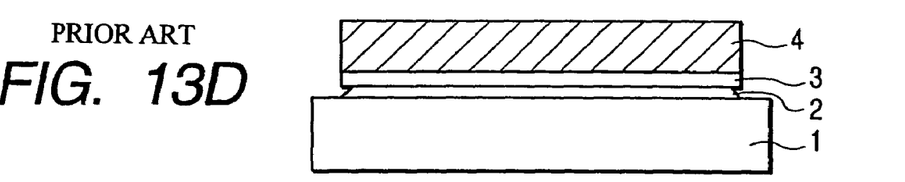
Figure 13E:
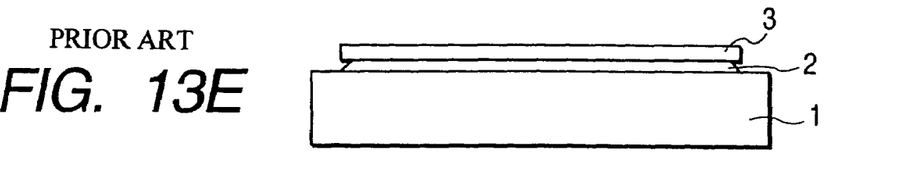

FIGS. 13A through 13E of the accompanying drawings schematically illustrate a silicon removing process proposed by the inventors of the present invention. FIG. 13A shows an SOI substrate 5 prepared by bonding and etching-back operations and comprising an insulation film 2 and a thinned silicon layer 3 that are formed on a support member 1. An outer peripheral portion of the silicon layer 3 of the SOI substrate 5 has to be removed because the bonding strength is weak in that portion. The use of photolithography is the most popular technique for removing a silicon layer in the semiconductor technology. With such a technique, photoresist is applied to the surface of the SOI substrate and the applied photoresist is exposed to light so that only the photoresist on the portion of the silicon layer 3 to be removed may be removed. Thus, a photoresist mask as shown in FIG. 13B is produced. Then, as shown in FIG. 13C, the exposed extreme end portion of the silicon layer 3 showing only a weak bonding strength is removed, using the remaining photoresist as mask. Thereafter, a corresponding extreme end portion of the insulation film 2 located under the silicon layer 3 is removed. A wet etching technique using hydrofluoric acid as etchant is popularly employed for removing part of the insulation film 2 because it does not damage the underlying support member 1. Since the wet etching process proceeds isotropically, the insulation film 2 is also etched in an upper portion of its outer periphery located under the silicon layer 3 to produce an undercut as shown in FIG. 13D. The silicon removing process is completed when the photoresist is removed (FIG. 13E).

Thus, a peripheral portion of the silicon layer 3 showing a weak bonding strength is removed.

Note that, in the above illustration of an SOI substrate 5 prepared by bonding and etching-back operations, the support member 1 and the insulation film 2 are bonded together along their interface so that a portion of the insulation film 2 located directly under the removed extreme end portion of the silicon layer also has to be removed.

However, once an extreme end portion of the silicon layer 3 showing a weak bonding strength is removed, the remaining silicon layer 3 can become etched laterally when a corresponding extreme end portion of the insulation film 2 located under the silicon layer 3 is removed to produce an undercut there so that the outer peripheral end portion of the silicon layer located on the undercut will become overhung and not bonded at all. Then, the overhanging outer peripheral end portion of the silicon layer 3 can eventually give rise to a chipping phenomenon and produce debris.

SUMMARY OF THE INVENTION

Thus, it is the object of the present invention to provide a semiconductor substrate that does not produce a chipping phenomenon, giving rise to debris from the outer peripheral extremity of the semiconductor layer and also a method of manufacturing such a semiconductor substrate.

According to an aspect of the invention, the above object is achieved by providing a semiconductor substrate comprising a support member, an insulation layer arranged on the support member and a semiconductor layer arranged on the insulation layer, characterized in that the outer peripheral extremity of said semiconductor layer is located inside the outer peripheral extremity of said support member and the outer peripheral extremity of said insulation layer is located between the outer peripheral extremity of said semiconductor layer and that of said support member so that the outer peripheral portion of the semiconductor substrate including said insulation layer and said semiconductor layer shows a stepped profile.

According to another aspect of the invention, there is provided a method of manufacturing a semiconductor substrate having a support member, an insulation layer arranged on the support member and a semiconductor layer arranged on the insulation layer, characterized by comprising steps of removing an extreme portion from said insulation layer and also an extreme portion from said semiconductor layer so as to make both the outer peripheral extremity of said insulation layer and that of said semiconductor layer to be located inside the outer peripheral extremity of said support member and removing an extreme portion from said semiconductor layer so as to make the outer peripheral extremity of said semiconductor layer to be located inside the outer peripheral extremity of said insulation layer.

A semiconductor substrate having a configuration as described above can hardly produce an overhanging profile for the outer peripheral extremity and consequently reduce the possibility of occurrence of a chipping phenomenon to a great extent if the insulation layer is laterally etched in the manufacturing process.

Additionally, since the portion of the semiconductor substrate that shows a weak bonding strength is removed, the production of debris from the peripheral area of the substrate will be minimized.

BRIEF DESCRIPTION OF THE DRAWINGS

FIGS. 5A, 5B, 5C, 5CP, 5D, 5E, 5F and 5FP are schematic views of still another embodiment of semiconductor substrate according to the invention, showing different manufacturing steps.

DESCRIPTION OF THE PREFERRED EMBODIMENTS (First Embodiment)

Figure 1A:
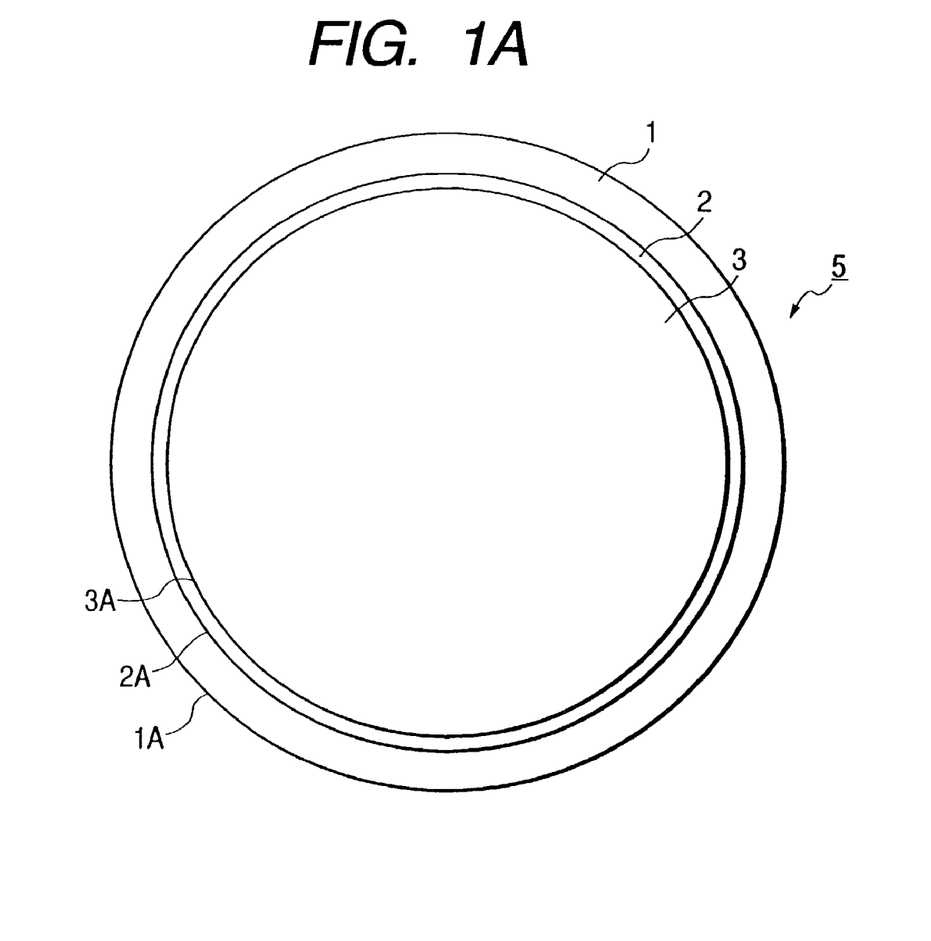
FIGS. 1A and 1B are schematic views of an embodiment of semiconductor substrate according to the invention.
Figure 1B:
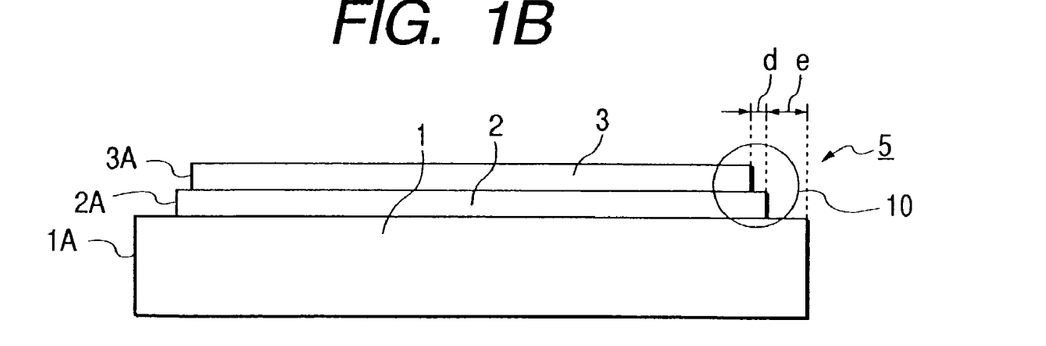

FIGS. 1A and 1B are a schematic plan view and a schematic cross sectional side view of a basic embodiment of semiconductor substrate according to the invention.

In the semiconductor substrate 5 of this embodiment, the outer peripheral extremity 3A of the semiconductor layer 3 is located inside the outer peripheral extremity 1A of the support member 1 and the outer peripheral extremity 2A of the insulation layer 2 is located between the outer peripheral extremity 3A of the semiconductor layer 3 and the outer peripheral extremity 1A of the support member 1 so that the outer peripheral portion 10 of the embodiment including the semiconductor layer 3 and the insulation layer 2 shows a stepped profile. More specifically, the bottom of the outer peripheral extremity of the semiconductor layer 3 and the top of the outer peripheral extremity of the insulation layer 2 are offset relative to each other by a horizontal distance d so that, unlike FIG. 13E, the outer peripheral extremity of the semiconductor layer 3 does not show an overhanging profile. In other words, the embodiment has a terrace with width d on the outer peripheral portion of the insulation layer 2. Therefore, the outer peripheral extremity of the semiconductor layer 3 can hardly give rise to a chipping phenomenon and debris.

For the purpose of the invention, the support member 1 is preferably a substrate made from a preform of a semiconductor material such as Si, Ge, GaAs or InP. In particular, Si wafers are preferably used.

For the purpose of the invention, the insulation layer is preferably made of an insulating material such as silicon oxide or silicon nitride.

For the purpose of the invention, the semiconductor layer preferably comprises at least a layer of a material selected from a group of semiconductor materials including Si, Ge, SiGe, SiC, GaAs, GaAlAs, InP and GaN.

For the purpose of the invention, the horizontal offset d is preferably not less than 2 microns, more preferably no less than 2 microns and not more than 1,000 microns.

For the purpose of the invention, the thickness of the semiconductor layer is preferably not less than 10 nanometers and not more than 10 microns, more preferably not less than 10 nanometers and not more than 2 microns.

For the purpose of the invention, the thickness of the insulation layer is preferably not less than 10 nanometers and not more than 10 microns, more preferably not less than 10 nanometers and not more than 2 microns.

For the purpose of the invention, a process comprising a bonding step is preferably used for preparing an SOI substrate 5 before processing the outer peripheral portion thereof. Specific examples of manufacturing process that can be used for the purpose of the invention include the methods described in Japanese Patent No. 2608351 and U.S. Pat. No. 5,371,037, Japanese Patent Application Laid-Open No. 7-302889 and Japanese Patent Application Laid-Open No. 5-211128 and U.S. Pat. No. 5,374,564.

Particularly, both the method disclosed in Japanese Patent No. 2608351 and U.S. Pat. No. 5,371,037 and the one disclosed in Japanese Patent Application Laid-Open No. 7-302889 comprise steps of preparing a first member having a porous single crystal semiconductor layer and a non-porous single crystal semiconductor layer, bonding said first member and a second member with an insulation layer interposed therebetween so as to produce a multilayer structure with said non-porous single crystal semiconductor layer located inside and removing said non-porous single crystal semiconductor layer from said multilayer structure. Said semiconductor layer contains silicon and either of the above methods can be used to prepare an SOI substrate containing silicon single crystal whose crystallinity is as excellent as that of a single crystal wafer.

The method disclosed in Japanese Patent Application Laid-Open No. 5-211128 and U.S. Pat. No. 5,374,564 comprises steps of forming a silicon oxide layer on the surface of a single crystal silicon wafer substrate, implanting either hydrogen gas ions or rare gas ions into the wafer from the side of the silicon oxide layer, forming a micro-bubble layer in the single crystal silicon wafer, bonding the wafer to another substrate operating as support member at the side of the silicon oxide and then separating the bonded substrates along the micro-bubble layer to produce an SOI substrate. Then, this SOI substrate may be used to prepare a semiconductor substrate as described above by referring to the first embodiment of the invention.

When a semiconductor wafer such as an Si wafer is used as starting material of an SOI substrate prepared by means of a bonding technique, it should be noted that the wafer is beveled both at the top and at the bottom of its outer peripheral extremity. Therefore, in the SOI substrate the outer peripheral extremity of the semiconductor layer (or the insulation layer) and that of the support member may be offset to a slight extent before being subjected to an operation of processing the outer peripheral portion thereof according to the invention.

Then, the outer peripheral portion of the semiconductor substrate including said insulation layer and said semiconductor layer is processed to show a stepped profile as seen from FIGS. 1A and 1B.

Techniques that can preferably be used for the processing operation include wet or dry etching using an etching mask and polishing such as chemical mechanical polishing (CMP).

Both the outer peripheral portion of the semiconductor layer and that of the insulation layer may be processed to show, a tapered or sloped profile in such a way that the top surface and the lateral surface thereof intersect each other with an angle greater than the right angle as will be described in greater detail hereinafter.

If the semiconductor substrate is to be etched to show a stepped profile, the etching process may be that of wet etching or that of dry etching. For etching the silicon layer, for example, a mixture solution of hydrogen fluoride and nitric acid or TMAH (trimethylammoniumhydroxide) may be used as etchant when a wet etching technique is used, whereas chlorine, $CF_4$ or $SF_6$ may be used as etchant when a dry etching technique is used. Similarly, for etching the silicon oxide film (insulation layer 2), a hydrofluoric acid solution or a buffered hydrofluoric acid solution may popularly be used in a wet etching process, whereas $CH_3$ may be used in a dry etching process. The etching mode may be isotropic or anisotropic.

An isotropic etching process, an edge etcher and an edge polisher may preferably be used to process the semiconductor layer and the insulation layer to make them show a tapered profile for the purpose of the invention.

The following embodiments are realized by modifying the above described first embodiment in various different ways.

(Second Embodiment)

Figure 2A:
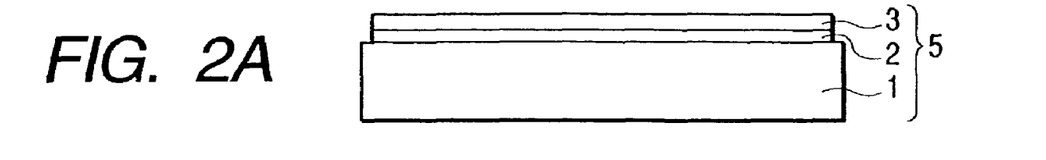
FIGS. 2A, 2B, 2C, 2D, 2E and 2F are schematic views of another embodiment of semiconductor substrate according to the invention, showing different manufacturing steps.
Figure 2B:
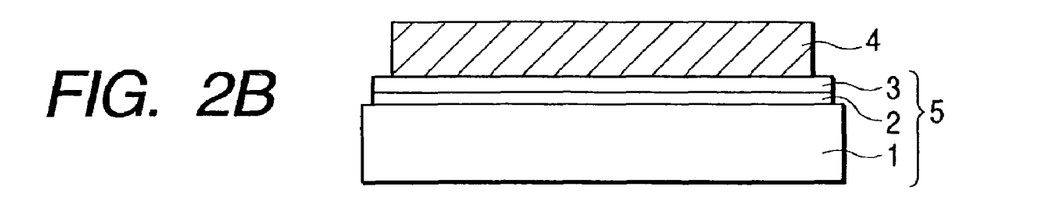
Figure 2C:
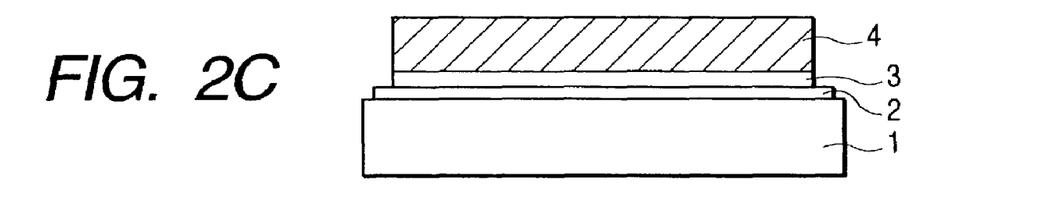
Figure 2D:
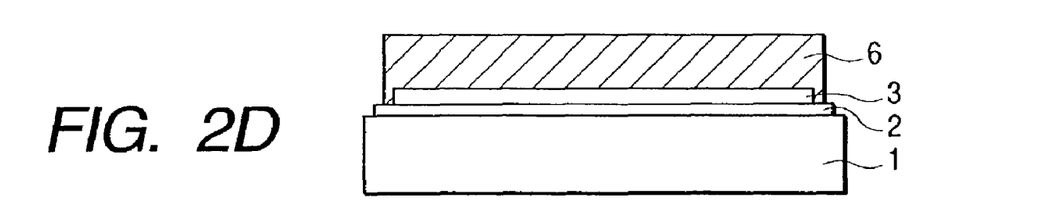
Figure 2E:
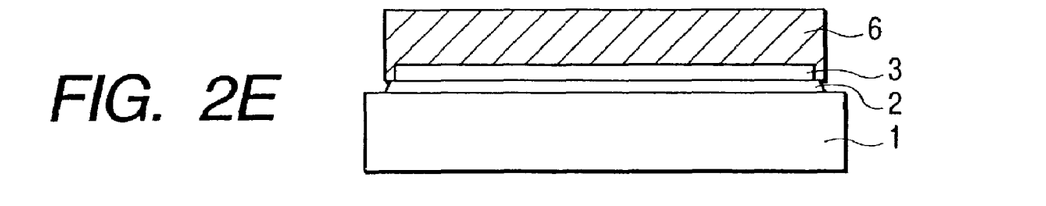
Figure 2F:
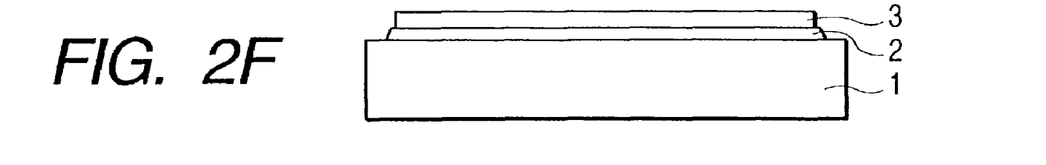

The following manufacturing steps may well be used for the second embodiment. Firstly, an SOI substrate 5 is prepared as shown in FIG. 2A by means of a bonding technique. The SOI substrate 5 comprises a support member 1, which is a single silicon substrate, an insulation film 2 formed on the support member 1 typically by means of a dry oxidation technique, using only $O_2$ gas, or a wet oxidation technique, using steam, and a semiconductor (silicon) layer 3 epitaxially grown on the insulation film 2 by means of CVD (chemical vapor deposition). Then, an etching mask of photoresist 4 is formed on the silicon layer 3 in order to remove a portion of the silicon layer 3 that is located at the outer peripheral extremity thereof on the insulation film 2 and shows a weak bonding strength (FIG. 2B). Then, the silicon layer 3 is etched to remove the outer peripheral extremity thereof, using the photoresist 4 as mask (FIG. 2C). After removing the photoresist 4, photoresist 6 is applied anew for etching the insulation film 2 and subjected to a patterning operation (FIG. 2D). To realize an etching selectivity for the insulation film 2 relative to the underlying support member 1, the insulation film 2 is etched by means of wet etching, using hydrofluoric acid as etchant. While wet etching may inevitably be accompanied by side etching, this problem can be bypassed by selecting the mask dimensions so as not to etch the portion of the insulation film 2 located directly under the silicon layer 3 if it is undercut (FIG. 2E). Finally, an SOI substrate having a cross sectional view as shown in FIG. 2F will be obtained by removing the photoresist 6. Note that both the photoresist 4 and the photoresist 6 may be of the ordinary positive type or of the ordinary negative type. A popular example of photoresist of the positive type is novolak resin that can be applied by spinning. In place of patterning the applied photoresist, a mask may be bonded to the silicon layer 3 so long as an etching mask is appropriately placed in position.

The method of preparing an SOI substrate 5 for this embodiment is not limited to the above described one, which may be replaced by some other appropriate method.

(Third Embodiment)

Figure 3A:
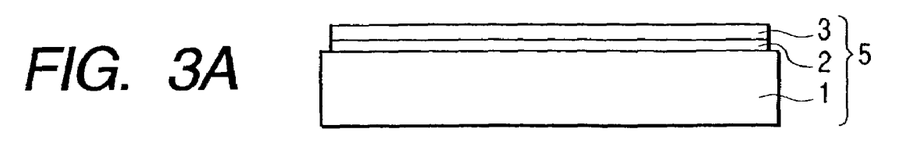
FIGS. 3A, 3B, 3C, 3D and 3E are schematic views of still another embodiment of semiconductor substrate according to the invention, showing different manufacturing steps.
Figure 3B:
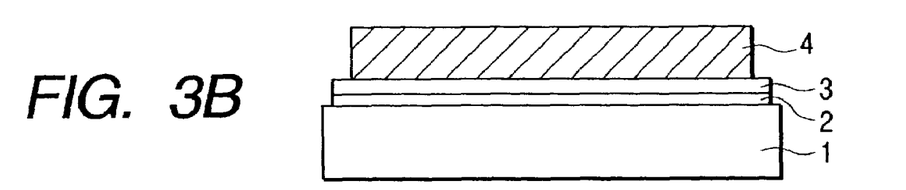
Figure 3C:
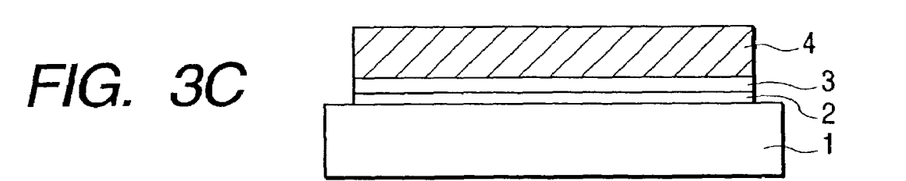
Figure 3D:
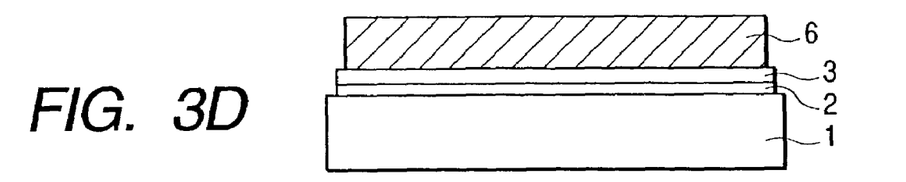

FIGS. 3A through 3E schematically illustrate a third embodiment of manufacturing an SOI substrate according to the invention, showing different manufacturing steps. Firstly, an SOI substrate 5 comprising an insulation film 2 and a silicon layer 3 arranged on a support member 1 is prepared (FIG. 3A). Photoresist 4 is applied onto the SOI substrate 5 and subjected to a patterning operation to make it show a desired pattern (FIG. 3B). Then, an extreme end portion of the silicon layer 3 and also an extreme end portion of the insulation film 2 are etched out successively (FIG. 3C). As a result, the portion of the silicon layer 3 and that of the insulation film 2 on the support member 1 that are not covered by the photoresist 4 are removed successively. Then, after removing the photoresist 4, another photoresist pattern 6 is formed. Care should be taken to make sure that the outer peripheral extremity of this resist pattern is located inside the outer peripheral extremity of the first resist pattern. Note that, the first photoresist 4 does not necessarily have to be removed but may be reduced so that its boundary line is located inside the original boundary line without applying photoresist 6 anew to give rise to a same effect (FIG. 3D).

Figure 3E:
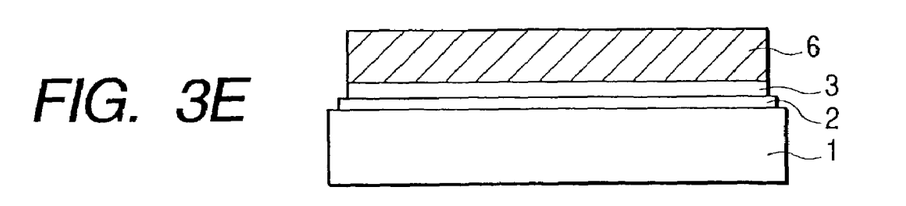

Then, only an extreme end portion of the silicon layer 3 is etched out to make the outer peripheral extremity of the silicon layer 3 offset from that of the insulation film 2 (FIG. 3E).

While photoresist is used in the above described manufacturing method, a semiconductor substrate according to the invention can be produced without using a photolithography process and the etching operation may be conducted by masking the silicon substrate by means of a tape. Alternatively, the peripheral area of the silicon substrate may be etched stepwise by means of an edge etcher that is adapted to etch an object only peripherally. Still alternatively, a profile as shown in FIG. 2F may be produced in the outer peripheral portion by means of an edge polisher.

(Fourth Embodiment)

Figure 4A:
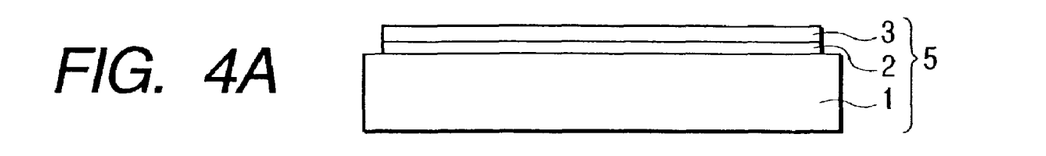
FIGS. 4A, 4B, 4C, 4D, 4E and 4F are schematic views of still another embodiments of semiconductor substrate according to the invention, showing different manufacturing steps.
Figure 4B:
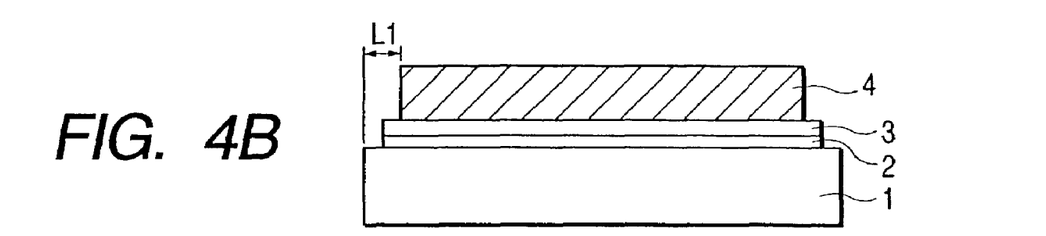

FIGS. 4A through 4F schematically illustrate a fourth embodiment of manufacturing an SOI substrate according to the invention, showing different manufacturing steps. Firstly, as shown in FIG. 4A, an SOI substrate 5 comprising a 2 μm thick insulation film 2 and a 2 μm thick silicon layer 3 arranged on a support member 1 is prepared and then, as shown in FIG. 4B, a first photoresist 4 is applied onto the SOI substrate 5 and subjected to a patterning operation to make it show a desired pattern (FIG. 3B). While a photomask having a profile similar to that of the wafer may be used for the exposure and patterning operation, a wafer edge exposure system adapted to expose only a peripheral portion of the wafer is used to expose a circular zone located along the outer peripheral extremity of the support member and having a width of L1 to light for removal in this embodiment.

Figure 4C:
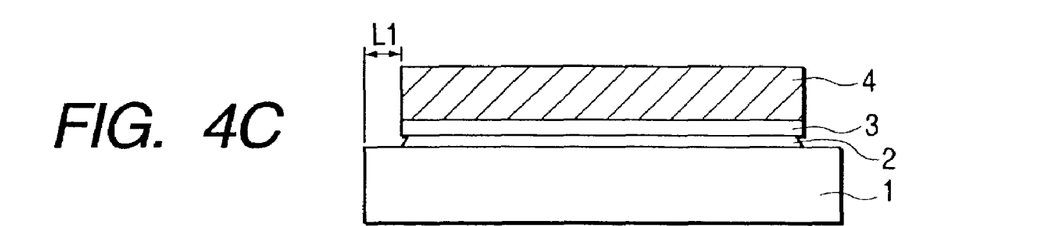
Figure 4D:
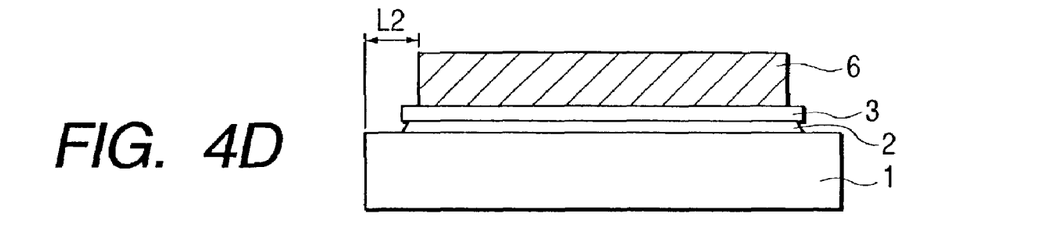

Then, as shown in FIG. 4C, an extreme end portion of the silicon layer 3 and that of the insulation film 2 of the SOI substrate 5 are etched successively. After removing the photoresist 4, a second photoresist 6 is applied and only a peripheral portion of the photoresist 6 having a width of L2 is exposed to light by means of the wafer edge exposure system to produce a photoresist pattern as shown in FIG. 4D. Thus, the outer peripheral extremity of the second photoresist 6 is located inside that of the first photoresist 4 by a distance of (L2−L1).

In view of the fact that the width accuracy of exposure of an ordinary wafer edge exposure system is about ±0.1 mm, L1 and L2 may preferably be about 1.8 mm and 2.0 mm respectively. Note that the difference between the outer peripheral extremity of the first photoresist 4 and that of the second photoresist 6 can be reduced further by using an improved precision exposure system for the patterning operation.

Figure 4E:
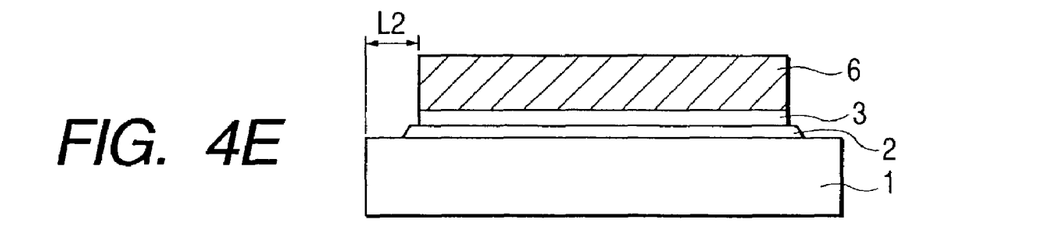

However, if an isotropic etching technique is used for etching the insulation film of FIG. 4E, a phenomenon of side etching can appear to an extent equal to the film thickness (2 μm) of the insulation film 2 when the insulation film has a tapered profile with a tapering angle of about 45°. Thus, the silicon layer 3 can be undercut at the bottom when the width is made smaller than the possible extent of side etching of the insulation film 2 (2 μm).

Therefore, in order to make this embodiment feasible, the distance between the width of the first photoresist 4 and that of the second photoresist 6 (L2−L1) needs to be greater than the extent of the side etching of the insulation film 2. While there is no upper limit for the widths, the number of devices that can be produced from the silicon active layer is reduced when the widths are too large so that, the widths should be greater than 5 microns depending on the accuracy of the exposure system and preferably between 100 microns and 500 microns when a wafer edge exposure system is used.

Figure 4F:
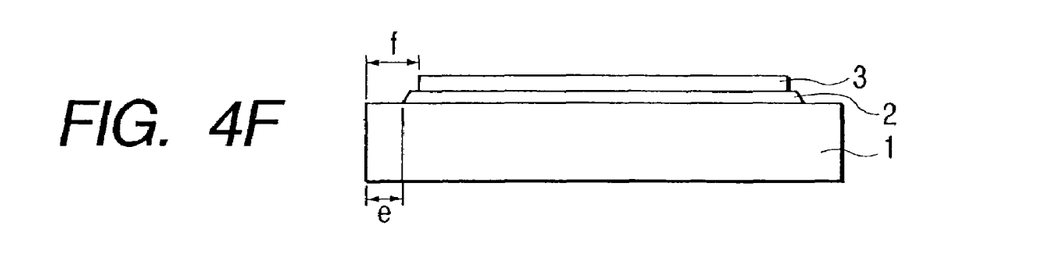

Then, only the outer peripheral portion of the silicon layer 3 is etched out as shown in FIG. 4E and the photoresist 6 is removed to complete the operation of removing the outer peripheral portion of the SOI substrate to produce a profile as shown in FIG. 4F, where f is about 2.0 mm, e is about 1.8 mm and d is about 198 μm.

With this embodiment, any chipping phenomenon in the silicon layer 3 and the insulation film 2 of the SOI substrate 5 can reliably be prevented from appearing.

(Fifth Embodiment)

In this embodiment, the angle of inclination of the lateral surface of the insulation film is made to be smaller than that of the lateral surface of the semiconductor layer.

Figures 5, 5C, 5D:
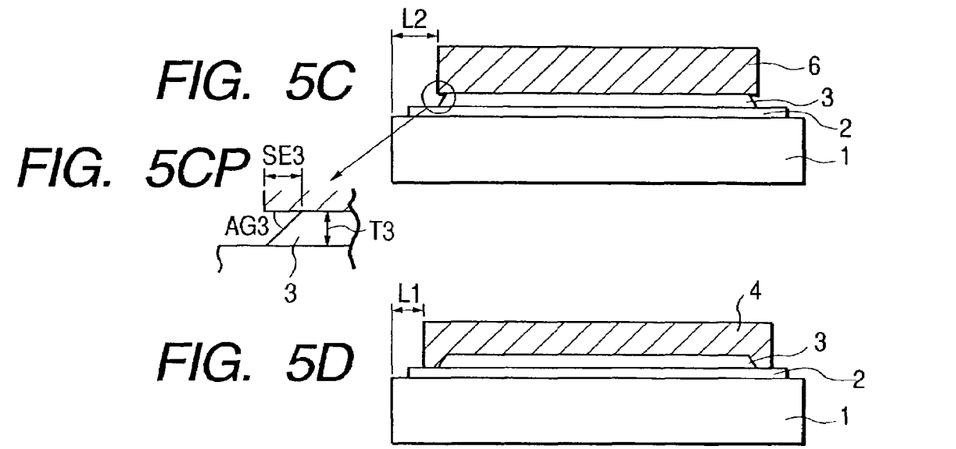
Figures 5, 5F:
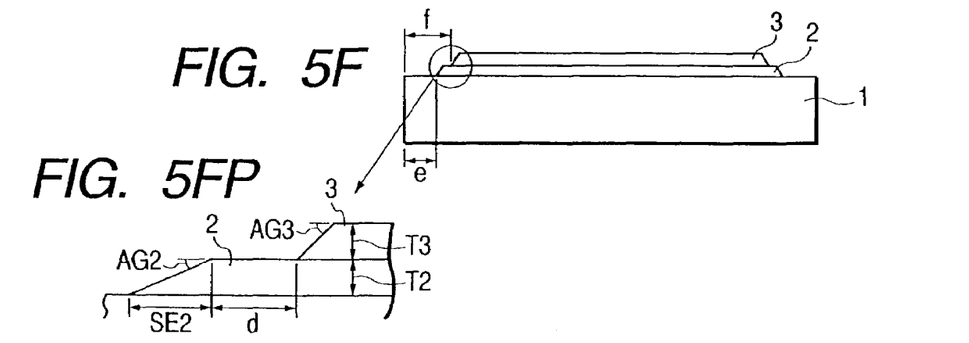
Figure 5A:
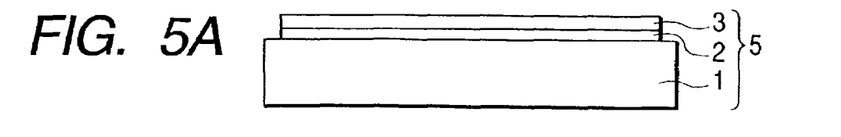
Figure 5B:
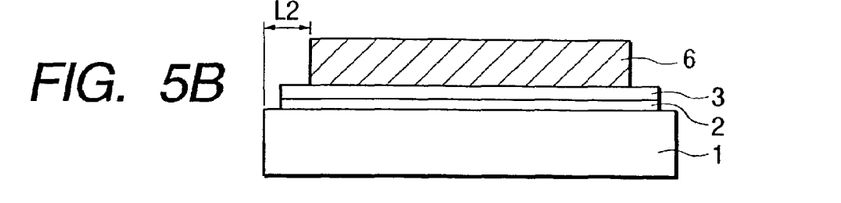

FIGS. 5A through 5F schematically illustrate a fifth embodiment of manufacturing an SOI substrate according to the invention, showing different manufacturing steps. Firstly, as shown in FIG. 5A, an SOI substrate 5 comprising a silicon oxide film 2 as an insulation film with a thickness T2 of 2 μm thick and a silicon layer 3 with a thickness T3 of 2 μm arranged on a supporting silicon substrate 1 is prepared by means of a bonding technique and then, as shown in FIG. 5B, a first photoresist 6 is applied onto the SOI substrate 5 and subjected to a patterning operation to make it show a desired pattern.

In this embodiment, the patterning operation is conducted by using a photomask having a half diameter smaller than that of the wafer by L2(=2.0 mm) and a contour similar to that of the wafer so that only the zone along the wafer edge with the width of L2 is exposed to light.

Then, as shown in FIG. 5C, only the extreme end portion of the silicon layer 3 is etched out. If a wet etching technique is employed, an alkaline TMAH (trimethylammonium-hydroxide) etching solution or an etching solution of a mixture of hydrofluoric acid and nitric acid will suitably be used for the etching operation. If, on the other hand, a dry etching technique is employed, an RIE (reactive ion etching) or CDE (chemical dry etching) system will popularly be used with $CF_4$ or $SF_6$ gas. While isotropic etching will take place in a wet etching system, conditions adapted to isotropic etching should be selected also for dry etching. For example, an isotropic radical etching operation can be realized in a parallel plate reactive ion etching system using $SF_6$ gas and $O_2$ gas with a high electric discharge pressure of 50 Pa and adapted to reduce the mean free path of ions and hence the rate of ionic etching.

The etching operation proceeds perfectly isotropically so that the lateral surface of the silicon layer 3 is tapered with an obtuse angle between the lateral surface and the top surface, while angle AG3 is substantially equal to 45° (FIG. 5CP). At the same time, a sufficiently large etch selectivity can be secured between the rate of etching the underlying silicon oxide film 2 and that of etching the silicon layer 3 so that consequently only the silicon layer 3 is so etched as to show a tapered profile.

After removing the photoresist 6, a second photoresist 4 is applied to the wafer and only the zone along the wafer edge with the width of L1 is exposed to light by using a photomask having a contour similar to that of the first photomask but greater than the latter by 8 microns to produce a patterned photoresist 4 as shown in FIG. 5D. If L1 is 1.992 mm, the resist pattern of the photoresist 2 has the outer peripheral extremity aligned with a line drawn outside the first photoresist 6 and separated from the latter by 8 microns.

Figure 5E:
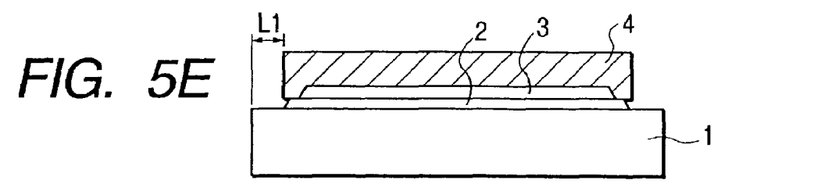

Then, as shown in FIG. 5E, only the outer peripheral portion of the silicon oxide film 2 of the SOI substrate 5 is etched out. If a wet etching technique is employed, an etching solution such as a buffered hydrofluoric acid (BHF) solution will suitably be used for the etching operation. If, on the other hand, a dry etching technique is employed, an RIE (reactive ion etching) or CDE (chemical dry etching) system will popularly be used with $CF_4$, $CHF_3$ or $H_2$ gas. While isotropic etching will take place in a wet etching system, conditions adapted to isotropic etching should be selected also for dry etching. For example, an isotropic etching operation can be realized by wet etching using a buffered hydrofluoric acid (BHF) solution until the silicon oxide film 2 is over-etched to a slight extent and angle AG2 becomes substantially equal to 30°. At the same time, a sufficiently large etch selectivity can be secured between the rate of etching the underlying silicon oxide film 2 and that of etching the silicon layer 3 so that consequently only the silicon oxide film 2 is so etched as to show a tapered profile with angle AG2 of 30° a as shown in FIG. 5E (see also FIG. 5FP).

When the silicon oxide film 2 is etched to make it show a tapered profile in the outer peripheral portion with angle AG2 equal to 30°, a side etching of 2.8 um occurs to the insulating silicon oxide film 2 having a film thickness of 2 μm. Thus, the silicon layer 3 can be undercut at the bottom when the width is made smaller than the possible extent of side etching of the insulation film 2.

Therefore, in order to make this embodiment feasible, the difference (L2−L1) between the width of the first photoresist 6 and that of the second photoresist 4 needs to be greater than the extent of the side etching of the insulation film 2. While there is no upper limit for the widths, the number of devices that can be produced from the silicon active layer is reduced when the widths are too large so that, they should be greater than 5 microns depending on the accuracy of the exposure system and preferably between 100 microns and 500 microns when a wafer edge exposure system is used.

Finally, the photoresist 4 is removed to produce a tapered and terraced profile as shown in FIG. 5F with the angle AG2 of 30' and a terrace width d of 5.2 μm. With a mildly tapered and terraced profile, the wafer would not show any undercut due to side etching in the subsequent cleansing and etching processes. Any undercut can result in producing particles particularly when a chipping phenomenon appears to the silicon layer 3 and/or the cleansing water is not drained satisfactorily. If the silicon oxide film is expected to become a victim of side etching, any side etching phenomenon can be prevented by providing a large difference between the width of the first photoresist 6 and that of the second photoresist 4 so that no undercut would occur to the silicon oxide film. Then, there will be produced a semiconductor substrate from whose insulation film an extreme end portion is removed with a width e (=L1).

(Sixth Embodiment)

Figure 6A:
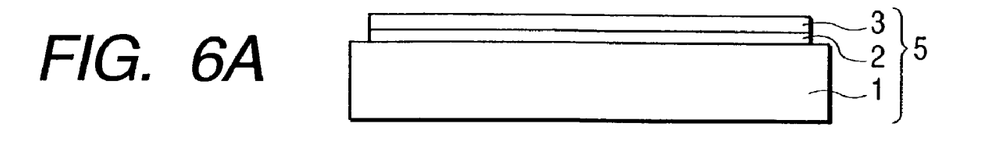
FIGS. 6A, 6B, 6C, 6D, 6E and 6F are schematic views of still another embodiment of semiconductor substrate according to the invention, showing different manufacturing steps.

FIGS. 6A through 6F schematically illustrate a sixth embodiment of manufacturing an SOI substrate according to the invention, showing different manufacturing steps. Firstly, as shown in FIG. 6A, an 8-inch (diameter, 200 mm) SOI substrate 5 comprising a 200 nm thick silicon oxide film 2 as an insulation film and a 200 nm thick silicon layer 3 arranged on a supporting silicon substrate 1 is prepared by means of a bonding technique.

Figure 6B:
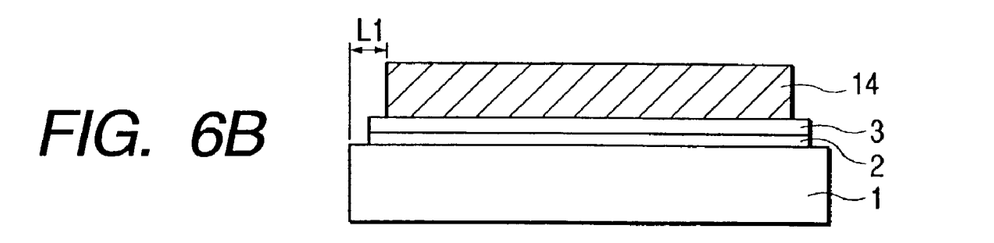
Figure 6C:
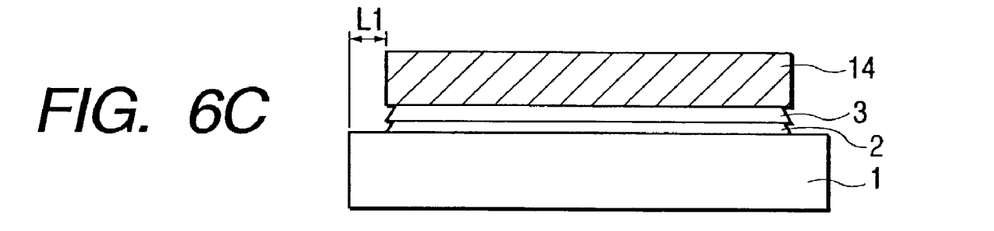

Then, as shown in FIG. 6B, a first mask tape 14 is applied onto the SOI substrate 5 with the center of the mask tape aligned with that of the wafer. A mask tape 14 with a diameter of e.g. 196.8 mm may suitably be used for this embodiment. Then, as shown in FIG. 6C, the extreme end portion of the silicon layer 3 and that of the insulation film 2 are etched out successively. The lateral side of the insulation film 2 and that of the silicon layer 3 are made to show an acute angle of inclination by controlling the duration of the etching operation.

Figure 6D:
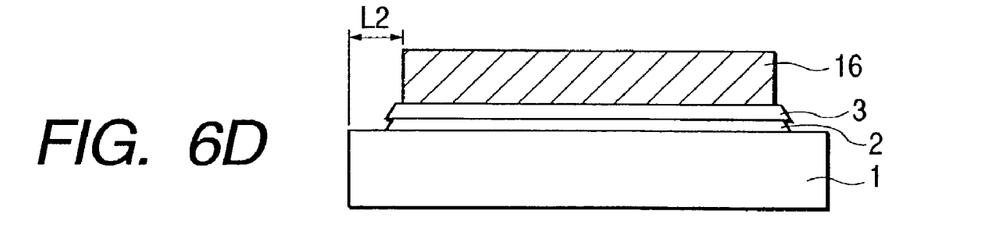

Then, after peeling off the mask tape 14 by means of a tape peeling machine, another mask tape 16 with a diameter of e.g. 196.0 mm is applied onto the wafer with the center of the mask tape aligned with that of the wafer as shown in FIG. 6D. Thus, the first mask tape 14 is arranged inside the second mask tape 16 and offset by 0.4 mm at any point on its outer boundary. This value is selected in view of the alignment accuracy of the tape applicator machine expected to be used. For this embodiment, it is about ±0.2 mm. If a tape applicator machine with a better alignment accuracy is used, the difference (L2−L1) between the width of the zone exposed from the first mask tape 14 and that of the zone exposed from the second mask tape 16 can be further reduced. While there is no upper limit for the widths (L1, L2), the number of devices that can be produced from the silicon active layer is reduced when they are too large so that, they should be between 10 microns and 1 millimeter depending on the accuracy of the tape applicator machine and preferably between 100 microns and 500 microns in practical uses.

Figure 6E:
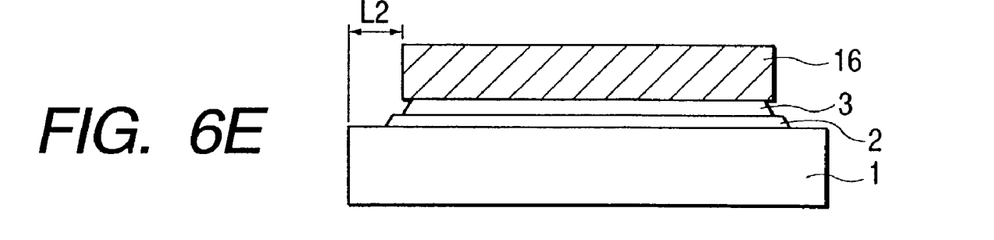
Figure 6F:
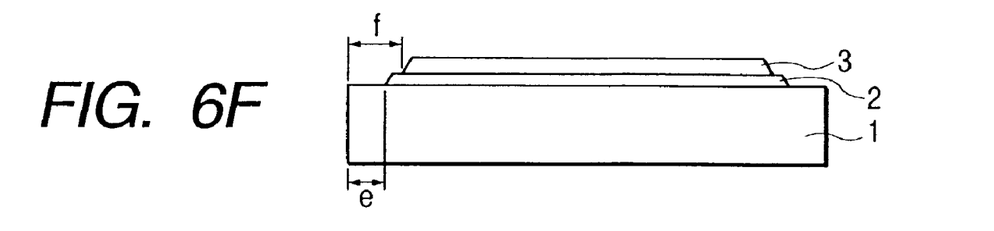

Then, as shown in FIG. 6E, only the outer peripheral portion of the silicon layer 3 is etched out and the mask tape 16 is peeled off by means of a tape peeling machine to produce a stepped profile for the outer peripheral portion of the SOI substrate as shown in FIG. 6F.

While the height of the steps cannot be reduced to the level of several microns unlike the case of using photoresist because of the relatively poor accuracy of the mask tapes 14 and 16, the cost of the mask tapes is as low as about a half of the cost of using photoresist, including the cost of the developing solution, and hence the technique of using mask tapes provides remarkable practical advantages over the etching technique particularly in view of the fact that the tape applicator machine and the tape peeling machine are less costly than a resist coater and an exposure system.

(Seventh Embodiment)

Figure 7A:
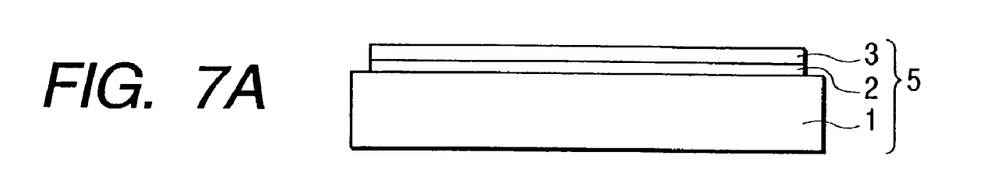
FIGS. 7A, 7B and 7C are schematic views of still another embodiment of semiconductor substrate according to the invention, showing different manufacturing steps.
Figure 7B:
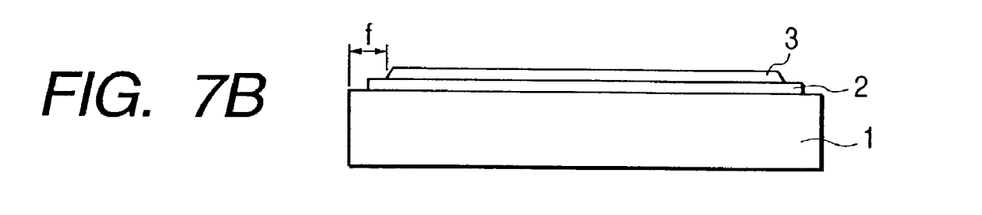
Figure 7C:
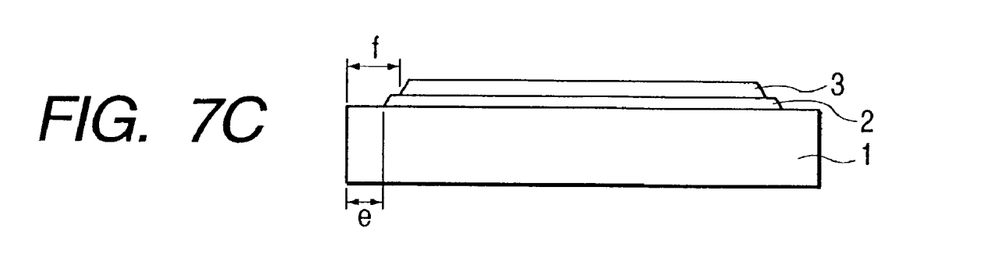

FIGS. 7A through 7C schematically illustrate a seventh embodiment of manufacturing an SOI substrate according to the invention, showing different manufacturing steps. Firstly, as shown in FIG. 7A, an 8-inch (diameter, 200 mm) SOI substrate 5 comprising a 200 nm thick silicon oxide film 2 as an insulation layer and a 200 nm thick silicon layer 3 arranged on a supporting silicon substrate 1 is prepared by means of a bonding technique.

Figure 8A:
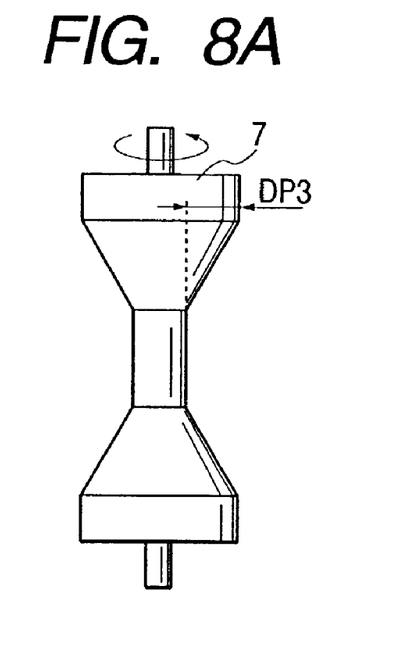
FIGS. 8A and 8B are schematic views of edge etchers that can be used for the purpose of the present invention.

Then, the silicon layer 3 of the SOI substrate 5 is etched by means of a rotary-type sheet edge etcher adapted to etch wafers on a sheet by sheet basis and having a configuration as shown in FIG. 8A. Such an edge etcher is described in Japanese Patent Publication No. 7-15897 and comprises a roller pad 7 so that the wafer is etched as the roller pad 7 soaked with etching solution is pressed against it. During the etching operation, nitrogen gas ($N_2$) blows out through a ring-shaped nozzle (not shown) arranged above the substrate in order to prevent the steam of the etching solution from flowing onto the surface of the wafer so that the edge etcher does not require the use of an etching mask.

The depth DP3 of the roller pad 7 for etching the silicon layer 3 will be about 1.8 mm and the etching depth can be controlled by appropriately selecting the pressure under which the roller pad 7 is pressed against the wafer. Then, the silicon layer 3 will be etched to show a profile mildly tapered from the wafer end by about 1.8 to 2.0 mm. At the same time, a sufficiently large etch selectivity can be secured between the rate of etching the silicon layer and that of etching the silicon oxide film 2 by using an alkaline TMAH (trimethylammoniumhydroxide) etching solution so that consequently only the silicon layer 3 is etched. A desired etch selectivity can also be selected by using an appropriate composition ratio of hydrofluoric acid and nitric acid. Thus, the silicon layer is processed to show a profile as illustrated in FIG. 7B.

Figure 8B:
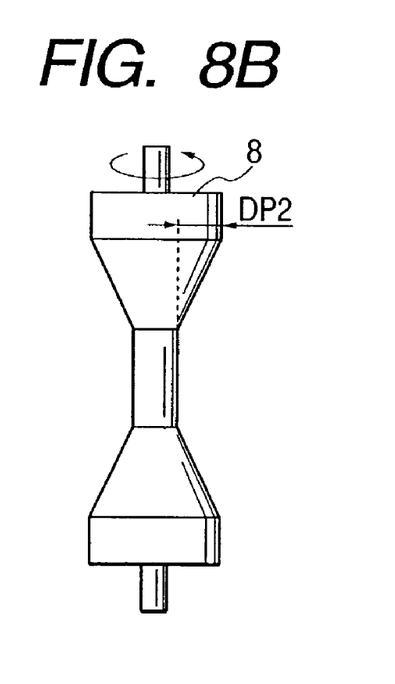

Then, after replacing the etching solution with pure water, the outer peripheral portion of the silicon oxide film 2 is etched by means of an apparatus as shown in FIG. 8B. The roller pad 8 to be used for etching the silicon oxide film 2 has a depth DP2 of about 1.4 mm and the etching depth can be controlled by appropriately selecting the pressure under which the roller pad 8 is pressed against the wafer. Then, the outer peripheral extremity of the silicon oxide film 2 is etched and recessed from the corresponding outer peripheral extremity of the support member by a distance of e=1.4 to 1.6 mm to show a mildly tapered profile. At the same time, a sufficiently large etch selectivity can be secured between the rate of etching the silicon layer and that of etching the silicon oxide film 2 by using an etching solution containing hydrofluoric acid or buffered hydrofluoric acid so that consequently only the silicon oxide film 2 is etched. Thus, an outer peripheral portion showing a stepped and mildly tapered profile is finally produced as shown in FIG. 7C.

The edge etcher to be used for this embodiment comprises roller pads for the first and second etching operations having respective depths DP3 and DP2 of 1.4 mm and 1.8 mm, the difference being 0.4 mm. This difference or the width of the exposed zone (f−e) can be reduced by selecting appropriate parameters because the tapered profile obtained by the etching operations can be modified as a function of the types and compositions of the etching solutions, the pressures under which the roller pads are pressed against the wafer and other factors. While there is no upper limit for the width (f−e), the number of devices that can be produced from the silicon active layer is reduced when the width (f−e) is too large so that the width (f−e) should be between 10 microns and 1 mm when an ordinary edge etcher is used and preferably it may be between 100 microns and 500 microns when the etching conditions are optimized. Finally, the etching solution is replaced by pure water to produce an outer peripheral portion having a mildly tapered and stepped profile.

While the width of the removed portion can be considerably large due to the mildly tapered profile, the use of an edge etcher is advantageous in terms of cost because it does not use photoresist nor tapes.

While the use of an edge etcher is described for this embodiment, it may be replaced by a rotary-type edge polisher. An edge polisher that can be used for the purpose of the invention is of the rotary-type having a rotating pad adapted to be supplied with a polishing agent and effectively polish the substrate if the angle between the pad and the substrate is varied. The profile of the polished product can be controlled by controlling the pressure under which the pad is pressed against the substrate and selecting the material and the hardness of the pad. While the polishing operation can be time consuming if the SOI layer has a large thickness and the outer peripheral portion of the SOI substrate can be removed by a large width to produce a mildly tapered profile, the use of an edge polisher is advantageous in terms of cost because it does not use photoresist nor tapes either.

Additionally, the use of a tape and that of an edge etcher (or an edge polisher) may be combined so that a tape is used for the first (or second) etching operation whereas an edge etcher (or an edge polisher) is used for the second (or first, whichever appropriate) etching operation. More broadly speaking, the use of photoresist, that of tapes, that of an edge etcher and that of an edge polisher may appropriately be combined for the purpose of the present invention from the viewpoint of the width of the zone to be removed from the SOI substrate, the tapered profile and the processing cost.

(Eighth Embodiment)

Figure 9A:
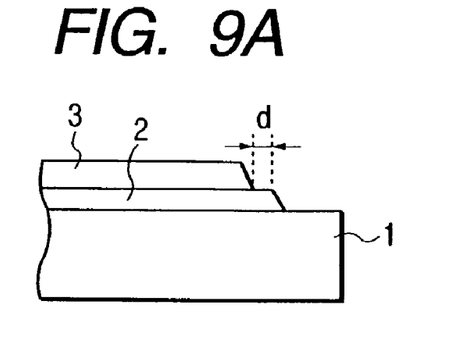
FIGS. 9A and 9B are schematic partial cross sectional views of still another embodiment of semiconductor substrate according to the invention.
Figure 9B:
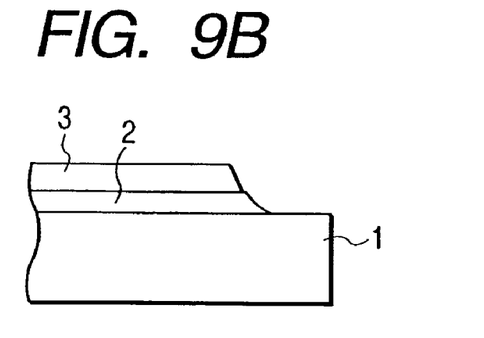

FIG. 9A is a schematic illustration of an outer peripheral portion of an eighth embodiment of semiconductor substrate according to the invention and FIG. 9B is a schematic illustration of the outer peripheral portion (S12) of the same embodiment as seen after having been etched at the lateral side thereof. On the other hand, FIG. 10A is a schematic illustration of an outer peripheral portion of a semiconductor substrate prepared for the purpose of comparison and FIG. 10B is a schematic illustration of the outer peripheral portion of the same semiconductor substrate as seen after having been etched at the lateral side thereof.

Figure 10A:
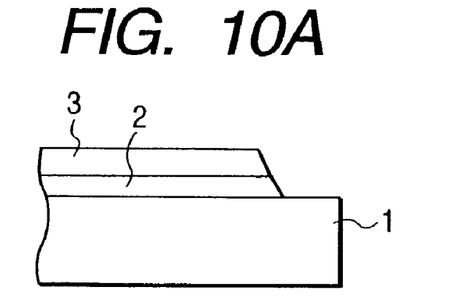
FIGS. 10A and 10B are schematic partial cross sectional views of a semiconductor substrate prepared for the purpose of comparison.
Figure 10B:
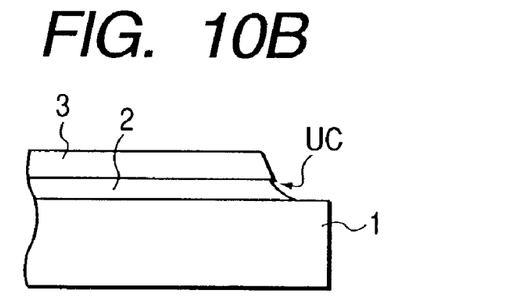

In the case of FIG. 10A, when the semiconductor substrate is subjected to a cleansing step such as an RCA cleansing operation using a cleansing solution containing hydrofluoric acid and having a side-etching effect, an undercut UC is produced under the outer peripheral extremity of the semiconductor layer 3 (at the top of the outer peripheral extremity of the insulation layer 2) as shown in FIG. 10B.

To the contrary, in the case of the eighth embodiment, where the semiconductor layer 3 and the insulation layer 2 produce a stepped profile at the outer peripheral portions thereof and the insulation layer 2 has a terrace as shown in FIG. 9A, no offset be produced between the top of the outer peripheral extremity of the insulation layer 2 and the bottom of the outer peripheral extremity of the semiconductor layer 3 if a slight side etching phenomenon occurs because the top of the outer peripheral extremity of the insulation layer 2 is offset from the bottom of the outer peripheral extremity of the semiconductor layer 3 by not less than 2 microns (horizontally). Thus, no undercut will appear in the structure of FIG. 9A.

On the other hand, when the lateral surface of the outer peripheral portion of the semiconductor layer 3 and that of the outer peripheral portion of the insulation layer 2 are in line with each other and not offset from each other as in the case of the structure of FIG. 10A, a side etching phenomenon proceeds from the top of the outer peripheral extremity of the insulation layer 2 to give rise to an undercut as shown in FIG. 10B.

While the distance between the bottom of the outer peripheral extremity of the semiconductor layer 3 and the top of the outer peripheral extremity of the insulation layer 2, or the offset d, is not less than 2 microns in the above description on the structure of FIG. 9A, this limit may be defined as a function of the extent of side etching particularly when the extent of side etching is remarkable in the process that involves a side etching effect exerted on the insulation layer 2. While the lower limit of the offset d is defined as a function of the extent of side etching, the upper limit of the offset d may be defined as a function of the extent to which the semiconductor layer is effectively utilized and depending on the wafer size, the required size and number of the semiconductor chip as well as other factors.

In view of the ordinary cleaning and processing steps for producing a semiconductor substrate, the offset d is typically not less than 2 microns and not more than 1 millimeter, preferably not less than 5 microns and not less than 1 millimeter, more preferably not less than 100 microns and not more than 500 microns.

(Ninth Embodiment)

Figure 11:
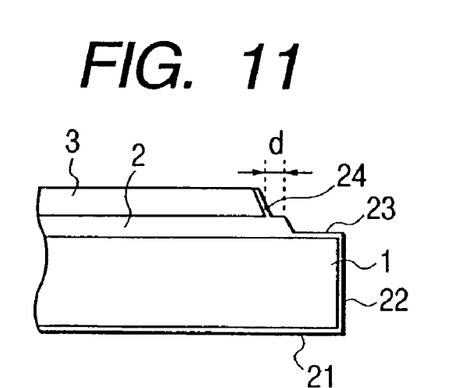
FIGS. 11 and 12 are schematic partial cross sectional views of still other embodiments of semiconductor substrate according to the invention.

FIG. 11 is a schematic illustration of an extreme portion of a ninth embodiment of semiconductor substrate according to the invention. This embodiment is obtained by modifying the structure of FIG. 9A and thin insulation films 24, 21, 22 and 23 are formed respectively on the lateral surface of the semiconductor layer 3 and the bottom surface, the lateral surface and the top surface of the peripheral portion of the support member 1.

In this embodiment again, the bottom of the outer peripheral portion of the semiconductor layer 3 and the top of the outer peripheral portion of the insulation layer 2 are offset by d, which is not smaller than 2 microns to show a stepped profile along the outer peripheral extremity of the semiconductor substrate so that any undercut can hardly be produced there more than ever.

Such a structure can be obtained either by oxidizing the structure of FIG. 9A with masking the top surface of the semiconductor layer 3, or by oxidizing the entire surface of the structure of FIG. 9A and subsequently removing the oxide film from the top surface of the semiconductor layer 3.

(Tenth Embodiment)

Figure 12:
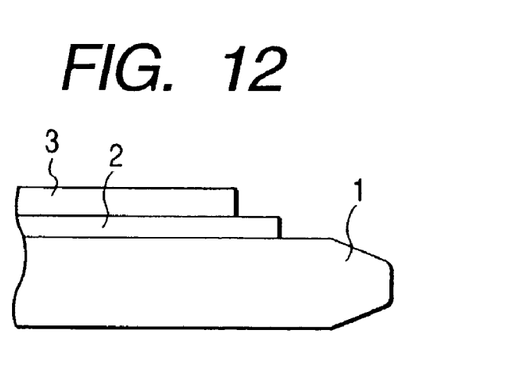

FIG. 12 is a schematic cross sectional view of a tenth embodiment of semiconductor substrate according to the invention, showing only an outer peripheral portion thereof. The outer peripheral extremity of the support member 1 is beveled both at the top and at the bottom. The bottom of the outer peripheral extremity of the semiconductor layer 3 and the top of the outer peripheral extremity of the insulation layer 2 are offset by more than 2 µm to produce a terrace on the top surface of the insulation layer 2.

Additionally, the bottom of the outer peripheral extremity of the insulation layer 2 and the outer peripheral extremity of the support member 1 are offset by more than 1 mm.

While the semiconductor layer 3 has a thickness greater than that of the insulation layer 2 in the structure of FIG. 12, the thickness of the former may alternatively be made smaller than that of the latter. Additionally, the lateral surfaces of the layers 2 and 3 may be tapered and/or the lateral surface of the outer peripheral portion of and the bottom surface of the support member may be coated with insulation films (21, 22) as in FIG. 11. Note that the support member 1 of a semiconductor substrate according to the invention has a thickness of several hundred microns, which is significantly greater than those of the layers 2 and 3.

As described above by referring to the preferred embodiments, both the semiconductor layer and the insulation layer may be removed partly at an area having a weak bonding strength, particularly in a outer peripheral extremity portion of the SOI substrate to produce a stepped profile along the outer peripheral extremities of the semiconductor layer and the insulation layer, that can effectively prevent any chipping phenomenon from appearing so that high quality SOI substrates may be manufactured on a stable basis.

Additionally, the lateral surface of the semiconductor layer and that of the insulation layer may be inclined to prevent the appearance of a chipping phenomenon and the production of debris so that high quality semiconductor devices may be manufactured at a high yield.

Still additionally, an SIMOX wafer can be used as SOI substrate for the purpose of the invention.

EXAMPLE

An 8-inch Si wafer was prepared as prime wafer and the surface was made porous by anodization to a depth of about 10 µm from the surface. The produced porous layer was thermally oxidized at 400° C. and then dipped into a dilute hydrofluoric acid solution to remove the oxide film from the top surface of the porous layer. Subsequently, the specimen was prebaked in a hydrogen atmosphere and then a non-porous Si layer was made to epitaxially grow to a height of 120 nm on the porous layer by CVD.

The surface of the Si layer obtained by epitaxial growth was then oxidized to produce an about 40 nm thick oxide film and a separately prepared 8-inch wafer was bonded as handle wafer to the prime wafer, before the assembly was subjected to a heat treatment process.

Then, the prime wafer was ground from the rear surface to expose the porous layer by means of RIE and then the porous layer was selectively removed by means of an etching solution containing hydrofluoric acid, hydrogen peroxide and alcohol. Then, the specimen was heat treated in a hydrogen atmosphere and the exposed surface of the non-porous Si layer that had been transferred onto the handle wafer was smoothed to produce an SOI substrate.

Subsequently, the specimen was subjected to the processing steps as described above by referring to FIGS. 7A through 7C to produce a semiconductor substrate having a structure as shown in FIG. 7C.

Similar specimens of semiconductor substrate were prepared and cleansed repeatedly. The number of particles adhering to each of the specimens of semiconductor substrate was measured after each cleansing operation.

As a result, it was found that the number of particles with a diameter greater than 0.15 µm was between $0.02/cm^2$ and $0.1/cm^2$ and did not vary remarkably for all the specimens.

COMPARATIVE EXAMPLE

A number of SOI substrates were prepared as in the above example. Subsequently, they were subjected to the processing steps as described above by referring to FIGS. 13A through 13E. Then, the obtained semiconductor substrates were cleansed repeatedly and the number of particles adhering to each of the specimens was observed as in the case of the above example.

As a result, it was found that the number of particles with a diameter greater than 0.15 µm was between $0.05/cm^2$ and $4/cm^2$ and remarkably varied after each measurement. Each increase in the number of particles was dominated by particles with a diameter between 0.05 µm and 0.4 µm.

What is claimed is:

1. A semiconductor substrate comprising a support member, an insulation layer arranged on the support member and a semiconductor layer arranged on the insulation layer,
    wherein an outer peripheral extremity of said semiconductor layer is located inside an outer peripheral extremity of said support member, and an outer peripheral extremity of said insulation layer is located between the outer peripheral extremity of said semiconductor layer and the outer peripheral extremity of said support member, so that the outer peripheral portion of the semiconductor substrate, including said insulation layer and said semiconductor layer, shows a stepped profile,
    wherein said insulation layer has a terrace on an upper surface of an outer peripheral portion thereof, wherein an offset between a bottom of the outer peripheral extremity of said semiconductor layer and a top of the outer peripheral extremity of said insulation layer is not smaller than 2 µm,
    wherein an angle of inclination formed between a lateral surface of the outer peripheral portion of said insulation layer and a bottom surface of the insulation layer is not greater than 45°,
    wherein an lateral surface of an outer peripheral portion of said semiconductor layer also is inclined, and
    wherein the angle of inclination between the lateral surface of the outer peripheral portion of said insulation layer and a bottom surface of said insulation layer is smaller than an angle of inclination between the lateral surface of said semiconductor layer and the bottom surface of said semiconductor layer.

* * * * *

UNITED STATES PATENT AND TRADEMARK OFFICE
CERTIFICATE OF CORRECTION

| | |
|---|---|
| PATENT NO. | : 7,245,002 B2 |
| APPLICATION NO. | : 10/143015 |
| DATED | : July 17, 2007 |
| INVENTOR(S) | : Yutaka Akino et al. |

Page 1 of 1

It is certified that error appears in the above-identified patent and that said Letters Patent is hereby corrected as shown below:

<u>COLUMN 1</u>:

Line 31, "paid" should read --made--; and Line 50, "paid" should read --made--.

<u>COLUMN 3</u>:

Line 58, "embodiments" should read --embodiment--.

<u>COLUMN 12</u>:

Line 48, "be" should read --will be--.

<u>COLUMN 16</u>:

Line 8, claim 1 "an" (first occurrence) should read --a--.

Signed and Sealed this

Ninth Day of September, 2008

JON W. DUDAS
*Director of the United States Patent and Trademark Office*